(12) United States Patent
Melanson et al.

(10) Patent No.: US 9,807,504 B2
(45) Date of Patent: *Oct. 31, 2017

(54) MULTI-PATH ANALOG FRONT END AND ANALOG-TO-DIGITAL CONVERTER FOR A SIGNAL PROCESSING SYSTEM WITH LOW-PASS FILTER BETWEEN PATHS

(71) Applicant: Cirrus Logic International Semiconductor Ltd., Edinburgh (GB)

(72) Inventors: John L. Melanson, Austin, TX (US); Aniruddha Satoskar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/370,576

(22) Filed: Dec. 6, 2016

(65) Prior Publication Data

US 2017/0188149 A1 Jun. 29, 2017

Related U.S. Application Data

(63) Continuation of application No. 14/982,767, filed on Dec. 29, 2015, now Pat. No. 9,543,975.

(51) Int. Cl.
*H03M 1/12* (2006.01)
*H04R 3/04* (2006.01)
*H03G 3/30* (2006.01)

(52) U.S. Cl.
CPC .............. *H04R 3/04* (2013.01); *H03G 3/3005* (2013.01); *H03M 1/12* (2013.01); *H03G 3/3089* (2013.01)

(58) Field of Classification Search
CPC .................................. H03M 1/12; H04R 3/04
(Continued)

(56) References Cited

U.S. PATENT DOCUMENTS 4,446,440 A 5/1984 Bell
4,493,091 A 1/1985 Gundry
(Continued)

FOREIGN PATENT DOCUMENTS

EP 0966105 A2 12/1999
EP 1575164 A2 9/2005
(Continued)

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.
(Continued)

*Primary Examiner* — Peguy Jean Pierre
(74) *Attorney, Agent, or Firm* — Jackson Walker L.L.P.

(57) ABSTRACT

In accordance with embodiments of the present disclosure, a processing system comprising may include a plurality of processing paths and a filter. The plurality of processing paths may include a first processing path and a second processing path, wherein the first processing path is configured to generate a first digital signal based on an analog input signal and the second processing path is configured to generate a second digital signal based on the analog input signal. The filter may have a corner frequency and may be configured to generate a filtered digital output signal combining spectral components of the first digital signal lower than the corner frequency and spectral components of the second digital signal higher than the corner frequency to generate a filtered digital signal.

22 Claims, 4 Drawing Sheets

(58) Field of Classification Search
USPC .............. 341/155, 153, 139, 118, 143, 144
See application file for complete search history.

(56) References Cited

U.S. PATENT DOCUMENTS

| | | |
|---|---|---|
| 4,890,107 A | 12/1989 | Pearce |
| 4,972,436 A | 11/1990 | Halim et al. |
| 4,999,628 A | 3/1991 | Kakubo et al. |
| 4,999,830 A | 3/1991 | Agazzi |
| 5,077,539 A | 12/1991 | Howatt |
| 5,148,167 A | 9/1992 | Ribner |
| 5,198,814 A | 3/1993 | Ogawara et al. |
| 5,321,758 A | 6/1994 | Charpentier et al. |
| 5,323,159 A | 6/1994 | Imamura et al. |
| 5,343,161 A | 8/1994 | Tokumo et al. |
| 5,550,923 A | 8/1996 | Hotvet et al. |
| 5,600,317 A | 2/1997 | Knoth et al. |
| 5,714,956 A | 2/1998 | Jahne et al. |
| 5,719,641 A | 2/1998 | Mizoguchi |
| 5,808,575 A | 9/1998 | Himeno et al. |
| 5,810,477 A | 9/1998 | Abraham et al. |
| 6,088,461 A | 7/2000 | Lin |
| 6,201,490 B1 | 3/2001 | Kawano et al. |
| 6,271,780 B1 | 8/2001 | Gong et al. |
| 6,333,707 B1 | 12/2001 | Oberhammer et al. |
| 6,353,404 B1 | 3/2002 | Kuroiwa |
| 6,542,612 B1 | 4/2003 | Needham |
| 6,683,494 B2 | 1/2004 | Stanley |
| 6,745,355 B1 | 6/2004 | Tamura |
| 6,768,443 B2 | 7/2004 | Willis |
| 6,822,595 B1 | 11/2004 | Robinson |
| 6,853,242 B2 | 2/2005 | Melanson et al. |
| 6,888,888 B1 | 5/2005 | Tu et al. |
| 6,897,794 B2 | 5/2005 | Kuyel et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,279,964 B2 | 10/2007 | Bolz et al. |
| 7,302,354 B2 | 11/2007 | Zhuge |
| 7,312,734 B2 | 12/2007 | McNeill et al. |
| 7,315,204 B2 | 1/2008 | Seven |
| 7,365,664 B2 | 4/2008 | Caduff et al. |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 | 3/2010 | De Ceuninck |
| 7,679,538 B2 | 3/2010 | Tsang |
| 7,893,856 B2 | 2/2011 | Ek et al. |
| 8,060,663 B2 | 11/2011 | Murray et al. |
| 8,130,126 B2 | 3/2012 | Breitschaedel et al. |
| 8,289,425 B2 | 10/2012 | Kanbe |
| 8,330,631 B2 | 12/2012 | Kumar et al. |
| 8,362,936 B2 | 1/2013 | Ledzius et al. |
| 8,462,035 B2 | 6/2013 | Schimper et al. |
| 8,483,753 B2 | 7/2013 | Behzad et al. |
| 8,508,397 B2 | 8/2013 | Hisch |
| 8,717,211 B2 | 5/2014 | Miao et al. |
| 8,786,477 B1 | 7/2014 | Albinet |
| 8,836,551 B2 | 9/2014 | Nozaki |
| 8,873,182 B2 | 10/2014 | Liao et al. |
| 8,878,708 B1 | 11/2014 | Sanders et al. |
| 8,952,837 B2 | 2/2015 | Kim et al. |
| 9,071,267 B1 | 6/2015 | Schneider et al. |
| 9,071,268 B1 | 6/2015 | Schneider et al. |
| 9,118,401 B1 | 8/2015 | Nieto et al. |
| 9,148,164 B1 | 9/2015 | Schneider et al. |
| 9,171,552 B1 | 10/2015 | Yang |
| 9,210,506 B1 | 12/2015 | Nawfal et al. |
| 9,306,588 B2 | 4/2016 | Das et al. |
| 9,337,795 B2 | 5/2016 | Das et al. |
| 9,391,576 B1 | 7/2016 | Satoskar et al. |
| 9,503,027 B2 | 11/2016 | Zanbaghi |
| 9,525,940 B1 | 12/2016 | Schneider et al. |
| 9,543,975 B1 | 1/2017 | Melanson et al. |
| 9,584,911 B2 | 2/2017 | Das et al. |
| 9,596,537 B2 | 3/2017 | He et al. |
| 9,635,310 B2 | 4/2017 | Chang et al. |
| 2001/0001547 A1 | 5/2001 | Delano et al. |
| 2001/0009565 A1 | 7/2001 | Singvall |
| 2004/0078200 A1 | 4/2004 | Alves |
| 2004/0184621 A1 | 9/2004 | Andersen et al. |
| 2005/0258989 A1 | 11/2005 | Li et al. |
| 2005/0276359 A1 | 12/2005 | Xiong |
| 2006/0056491 A1 | 3/2006 | Lim et al. |
| 2006/0064037 A1 | 3/2006 | Shalon et al. |
| 2006/0098827 A1 | 5/2006 | Paddock et al. |
| 2006/0284675 A1 | 12/2006 | Krochmal et al. |
| 2007/0026837 A1 | 2/2007 | Bagchi |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2008/0030577 A1 | 2/2008 | Cleary et al. |
| 2008/0114239 A1 | 5/2008 | Randall et al. |
| 2008/0143436 A1 | 6/2008 | Xu |
| 2008/0159444 A1 | 7/2008 | Terada |
| 2008/0198048 A1 | 8/2008 | Klein et al. |
| 2008/0292107 A1 | 11/2008 | Bizjak |
| 2009/0021643 A1 | 1/2009 | Hsueh et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0029109 A1 | 2/2011 | Thomsen et al. |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0188671 A1 | 8/2011 | Anderson et al. |
| 2011/0228952 A1 | 9/2011 | Lin |
| 2011/0242614 A1 | 10/2011 | Okada |
| 2011/0268301 A1 | 11/2011 | Nielsen et al. |
| 2011/0285463 A1 | 11/2011 | Walker et al. |
| 2012/0001786 A1 | 1/2012 | Hisch |
| 2012/0047535 A1 | 2/2012 | Bennett et al. |
| 2012/0133411 A1 | 5/2012 | Miao et al. |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |
| 2012/0242521 A1 | 9/2012 | Kinyua |
| 2012/0250893 A1 | 10/2012 | Carroll et al. |
| 2012/0263090 A1 | 10/2012 | Porat et al. |
| 2012/0280726 A1 | 11/2012 | Colombo et al. |
| 2013/0095870 A1 | 4/2013 | Phillips et al. |
| 2013/0106635 A1 | 5/2013 | Doi |
| 2013/0129117 A1 | 5/2013 | Thomsen et al. |
| 2013/0188808 A1 | 7/2013 | Pereira et al. |
| 2013/0241753 A1 | 9/2013 | Nozaki |
| 2013/0241755 A1 | 9/2013 | Chen et al. |
| 2014/0044280 A1 | 2/2014 | Jiang |
| 2014/0105256 A1 | 4/2014 | Hanevich et al. |
| 2014/0105273 A1 | 4/2014 | Chen et al. |
| 2014/0126747 A1 | 5/2014 | Huang |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2014/0368364 A1 | 12/2014 | Hsu |
| 2015/0009079 A1 | 1/2015 | Bojer |
| 2015/0170663 A1 | 6/2015 | Disch et al. |
| 2015/0214974 A1 | 7/2015 | Currivan |
| 2015/0214975 A1 | 7/2015 | Gomez et al. |
| 2015/0249466 A1 | 9/2015 | Elyada |
| 2015/0295584 A1 | 10/2015 | Das et al. |
| 2015/0381130 A1 | 12/2015 | Das et al. |
| 2016/0072465 A1 | 3/2016 | Das et al. |
| 2016/0080862 A1 | 3/2016 | He et al. |

(56) References Cited

U.S. PATENT DOCUMENTS

| | | |
|---|---|---|
| 2016/0080865 A1 | 3/2016 | He et al. |
| 2016/0173112 A1 | 6/2016 | Das et al. |
| 2016/0286310 A1 | 9/2016 | Das et al. |
| 2016/0365081 A1 | 12/2016 | Satoskar et al. |
| 2017/0047895 A1 | 2/2017 | Zanbaghi |
| 2017/0150257 A1 | 5/2017 | Das et al. |

FOREIGN PATENT DOCUMENTS

| | | |
|---|---|---|
| EP | 1753130 A1 | 2/2007 |
| EP | 1798852 A | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |
| GB | 2527677 B | 10/2016 |
| GB | 2539517 A | 12/2016 |
| JP | 2008294803 A | 12/2008 |
| WO | WO0054403 A1 | 9/2000 |
| WO | 02/37686 A2 | 5/2002 |
| WO | 2008067260 A1 | 6/2008 |
| WO | 2014113471 A1 | 7/2014 |
| WO | 2015160655 A1 | 10/2015 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |

OTHER PUBLICATIONS

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

GB Patent Application No. 1419651.3, Improved Analogue-to-Digital Convertor, filed Nov. 4, 2014, 65 pages.

Combined Search and Examination Report, GB Application No. GB1506258.1, dated Oct. 21, 2015, 6 pages.

International Search Report and Written Opinion, International Patent Application No. PCT/US2015/025329, dated Aug. 11, 2015, 9 pages.

International Search Report and Written Opinion, International Patent Application No. PCT/US2015/048633, dated Dec. 10, 2015, 11 pages.

International Search Report and Written Opinion, International Patent Application No. PCT/US2015/048591, dated Dec. 10, 2015, 11 pages.

Combined Search and Examination Report, GB Application No. GB1510578.6, dated Aug. 3, 2015, 3 pages.

International Search Report and Written Opinion, International Application No. PCT/US2015/056357, dated Jan. 29, 2015, 13 pages.

Combined Search and Examination Report, GB Application No. GB1514512.1, dated Feb. 11, 2016, 7 pages.

International Search Report and Written Opinion, International Application No. PCT/US2015/048609, dated Mar. 23, 2016, 23 pages.

International Search Report and Written Opinion, International Application No. PCT/US2016/022578, dated Jun. 22, 2016, 12 pages.

Combined Search and Examination Report, GB Application No. GB1600528.2, dated Jul. 7, 2016, 8 pages.

Combined Search and Examination Report, GB Application No. GB1603628.7, dated Aug. 24, 2016, 6 pages.

International Search Report and Written Opinion, International Application No. PCT/EP2016/062862, dated Aug. 26, 2016, 14 pages.

Combined Search and Examination Report, GB Application No. GB1602288.1, dated Aug. 9, 2016, 6 pages.

International Search Report and Written Opinion of the International Searching Authority, International Application No. PCT/US2016/065134, dated Mar. 15, 2017.

International Search Report and Written Opinion of the International Searching Authority, International Application No. PCT/US2016/040096, dateed Mar. 24, 2017.

International Search Report and Written Opinion of the International Searching Authority, International Application No. PCT/US2017/014240, dated Apr. 24, 2017.

Groeneweg, B.P., et al, A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.

Chen, K., et al, A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.

Combined Search and Examination Report under Sections 17 and 18(3) of the UKIPO, Application No. GB1620427.3, dated Jun. 1, 2017.

Combined Search and Examination Report under Sections 17 and 18(3) of the UKIPO, Application No. GB1620428.1, dated Jul. 21, 2017.

Combined Search and Examination Report under Sections 17 and 18(3) of the UKIPO, Application No. GB1700371.6, dated Aug. 1, 2017.

MULTI-PATH ANALOG FRONT END AND ANALOG-TO-DIGITAL CONVERTER FOR A SIGNAL PROCESSING SYSTEM WITH LOW-PASS FILTER BETWEEN PATHS

This application is a continuation of U.S. Non-Provisional application Ser. No. 14/982,767 filed on Dec. 29, 2015, which is incorporated by reference herein in its entirety.

FIELD OF DISCLOSURE

The present disclosure relates in general to signal processing systems, and more particularly, to multiple path signal processing systems.

BACKGROUND

The use of multipath analog-to-digital converters (ADCs) and analog front ends (AFEs) (e.g., two or more path ADCs/AFEs) in electrical circuits is known. Example multipath ADCs and AFEs and use of them in multiple electrical circuit paths are disclosed in U.S. Pat. No. 5,714,956 entitled "Process and System for the Analog-to-Digital Conversion of Signals" to Jahne et al. ("Jahne patent"), U.S. Pat. No. 5,600,317 entitled "Apparatus for the Conversion of Analog Audio Signals to a Digital Data Stream" to Knoth et al. ("Knoth patent") and U.S. Pat. No. 6,271,780 entitled "Gain Ranging Analog-to-Digital Converter with Error Correction" to Gong et al. ("Gong patent"). The use of multipath circuits may reduce noise as one path may be optimized for processing small amplitude signals (e.g., for processing low noise signals) while another circuit path with another set of ADC and AFE is optimized for large amplitude signals (e.g., allowing for higher dynamic range).

An example application for multipath ADCs/AFEs is use of it in a circuit for an audio system application, such as an audio mixing board or in a digital microphone system. Such an example application is disclosed in the Jahne patent. In designing a circuit with multipath ADCs/AFEs that are used in respective multiple circuit paths, a tradeoff may exist between allowing larger signal swing (e.g., to allow swing of a signal between larger scale amplitudes) and low noise. Furthermore, the multipath ADCs/AFEs may provide high dynamic range signal digitization, with higher dynamic range for a given input power, and lower overall area than would be possible with conventional means. In other words, by allowing a separate optimization for each type of signal (e.g., large and small signals) that is provided each respective path, multipath ADCs/AFEs allow the overall circuit to burn less power, consume less area, and save on other such design costs.

Despite their advantages, existing multipath ADC/AFE approaches have disadvantages and problems. For example, many existing approaches have disadvantages related to transitioning and switching between the multiple paths, as such switching may not be smooth, leading to undesirable signal artifacts, especially in audio applications in which such artifacts may be perceptible to a listener of an audio device. As another example, a trend in electric circuits is to scale circuitry to the integrated circuit level. However, existing approaches to multipath AFEs/ADCs do not scale well to the integrated circuit level.

SUMMARY

In accordance with the teachings of the present disclosure, certain disadvantages and problems associated with implementation of multiple AFE/ADC paths may be reduced or eliminated.

In accordance with embodiments of the present disclosure, a processing system comprising may include a plurality of processing paths and a filter. The plurality of processing paths may include a first processing path and a second processing path, wherein the first processing path is configured to generate a first digital signal based on an analog input signal and the second processing path is configured to generate a second digital signal based on the analog input signal. The filter may have a corner frequency and may be configured to generate a filtered digital output signal combining spectral components of the first digital signal lower than the corner frequency and spectral components of the second digital signal higher than the corner frequency to generate a filtered digital signal.

In accordance with these and other embodiments of the present disclosure, a method may include processing an analog input signal with a first processing path to generate a first digital signal based on the analog input signal, processing the analog input signal with a second processing path to generate a second digital signal based on the analog input signal, and generating, with a filter having a corner frequency, a filtered digital output signal combining spectral components of the first digital signal lower than the corner frequency and spectral components of the second digital signal higher than the corner frequency to generate a filtered digital signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
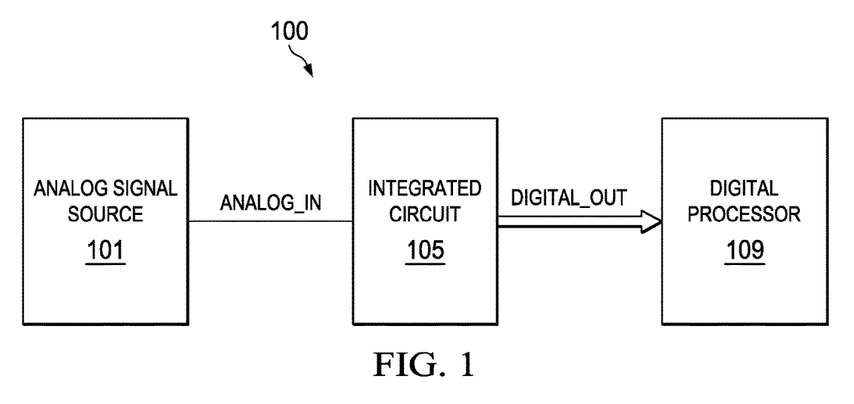
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an integrated circuit (IC) 105, and a digital processor 109. Analog signal source 101 may comprise any system, device, or apparatus configured to generate an analog electrical signal, for example an analog input signal ANALOG_IN. For example, in embodiments in which signal processing system 100 is a processing system, analog signal source 101 may comprise a microphone transducer.

Integrated circuit 105 may comprise any suitable system, device, or apparatus configured to process analog input signal ANALOG_IN to generate a digital output signal DIGITAL_OUT and condition digital output signal DIGITAL_OUT for transmission over a bus to digital processor 109. Once converted to digital output signal DIGITAL_OUT, the signal may be transmitted over significantly longer distances without being susceptible to noise as compared to an analog transmission over the same distance. In some embodiments, integrated circuit 105 may be disposed in close proximity with analog signal source 101 to ensure that the length of the analog line between analog signal source 101 and integrated circuit 105 is relatively short to minimize the amount of noise that can be picked up on an analog output line carrying analog input signal ANALOG_IN. For example, in some embodiments, analog signal source 101 and integrated circuit 105 may be formed on the same substrate. In other embodiments, analog signal source 101 and integrated circuit 105 may be formed on different substrates packaged within the same integrated circuit package.

Digital processor 109 may comprise any suitable system, device, or apparatus configured to process a digital output signal for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Signal processing system 100 may be used in any application in which it is desired to process an analog signal to generate a digital signal. Thus, in some embodiments, signal processing system 100 may be integral to an audio device that converts analog signals (e.g., from a microphone) to digital signals representing the sound incident on a microphone. As another example, signal processing system 100 may be integral to a radio-frequency device (e.g., a mobile telephone) to convert radio-frequency analog signals into digital signals.

Figure 2:
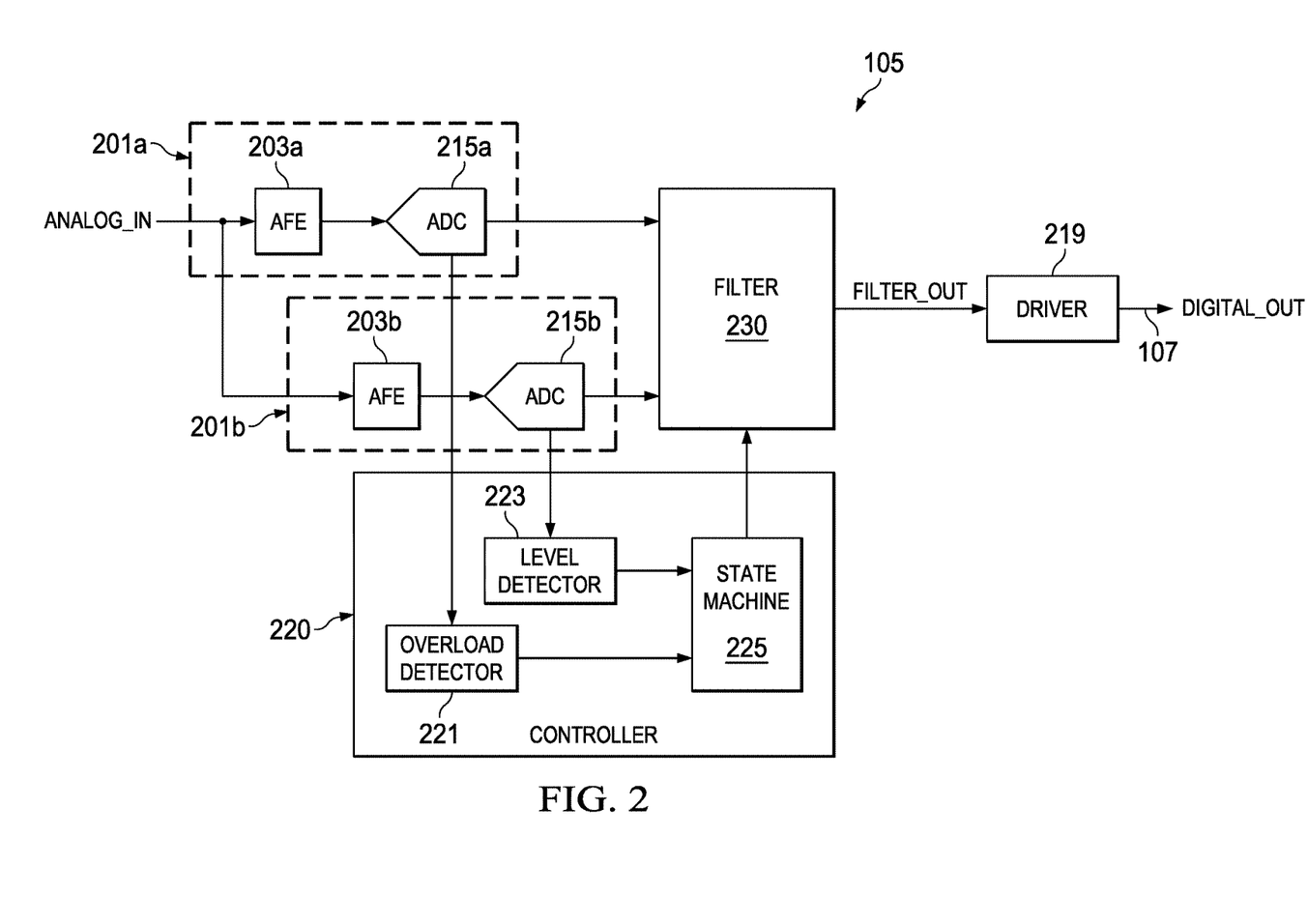
FIG. 2 illustrates a block diagram of selected components of an integrated circuit for processing an analog signal to generate a digital signal, in accordance with embodiments of the present disclosure.

FIG. 2 illustrates a block diagram of selected components of integrated circuit 105, in accordance with embodiments of the present disclosure. As shown in FIG. 2, integrated circuit 105 may include two or more processing paths 201a and 201b (which may be referred to herein individually as a processing path 201 and collectively as processing paths 201), each processing path 201 including a respective AFE 203 (e.g., AFE 203a, AFE 203b) and a respective ADC 215 (e.g., ADC 215a, ADC 215b). An AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. Selected components for example embodiments of AFEs 203a and 203b are discussed in greater detail below with respect to FIG. 3. The output of each AFE 203 may be communicated to a respective ADC 215 on one or more output lines.

An ADC 215 may comprise any suitable system, device, or apparatus configured to convert an analog signal received at its input, to a digital signal representative of analog input signal ANALOG_IN. ADC 215 may itself include one or more components (e.g., delta-sigma modulator, decimator, etc.) for carrying out the functionality of ADC 215. Selected components for the example embodiments of ADCs 215a and 215b are discussed in greater detail below with respect to FIG. 3.

Filter 230 may comprise any suitable system, device, or apparatus configured to, based on a corner frequency of filter 230 control the relative contributions of the digital signals output by processing paths 201a and 201b to a digital output signal FILTER_OUT generated by filter 230. For example, as such corner frequency increases, the contribution of the digital signal output by processing path 201a may become less dominant in digital output signal FILTER_OUT while the contribution of the digital signal output by processing path 201b may become more dominant in digital output signal FILTER_OUT. Conversely, as such corner frequency decreases, the contribution of the digital signal output by processing path 201a may become more dominant in digital output signal FILTER_OUT while the contribution of the digital signal output by processing path 201b may become less dominant in digital output signal FILTER_OUT. Thus, filter 230 may effectively serve as a combined filter which low-pass filters the digital signal output by processing path 201b and high-pass filters the digital signal output by processing path 201a and combines the filtered digital signals to generate digital output signal FILTER_OUT such that digital output signal FILTER_OUT includes the spectral components of digital signal output by processing path 201b lower than the corner frequency and includes the spectral components of digital signal output by processing path 201a higher than the corner frequency. Example embodiments of filter 230 are described in greater detail below with respect to FIGS. 3 and 4.

Controller 220 may comprise any suitable system, device, or apparatus for controlling a corner frequency of filter 230. In some embodiments, controller 220 may perform such control based on a magnitude of analog input signal ANALOG_IN or a signal derivative thereof. For example, controller 220 may include an overload detector 221 that may determine whether or not a signal derivative of analog input signal ANALOG_IN (e.g., a signal generated within ADC 215a) is likely to cause clipping or other distortion of digital output signal DIGITAL_OUT if a particular processing path (e.g., processing path 201a) is the dominant component of digital output signal DIGITAL_OUT. If clipping or other distortion of digital output signal DIGITAL_OUT is likely if the particular processing path (e.g., processing path 201a) is dominant, state machine 225 of controller 220 may generate a control signal to increase a corner frequency of filter 230 such that such processing path 201a becomes less dominant. To further illustrate, in some embodiments, processing path 201a may be a path adapted for low amplitudes of analog input signal ANALOG_IN and may thus have a high signal gain, while processing path 201b may be a path adapted for higher amplitudes of analog input signal ANALOG_IN and may thus have a lower signal gain. Thus, if analog input signal ANALOG_IN or a derivative thereof is greater than a threshold value indicative of a condition whereby digital output signal DIGITAL_OUT may experience clipping or other distortion if processing path 201a is dominant, overload detector 221 may detect such condition, and cause state machine 225 to generate a control signal to increase the corner frequency of filter 230 in order to make processing path 201a less dominant in digital output signal DIGITAL_OUT.

As another example, controller 220 may include a level detector 223 that may detect an amplitude of analog input signal ANALOG_IN or a signal derivative thereof (e.g., a signal generated within ADC 215b) and communicate a signal indicative of such amplitude to state machine 225. Responsive to the signal received from level detector 223, state machine 225 may generate a control signal communicated to filter 230. To illustrate, as analog input signal ANALOG_IN decreases from a relatively high amplitude to a lower amplitude, it may cross a threshold amplitude level whereby controller 220 may decrease the corner frequency of filter 230, in order to make the output of processing path 201a more dominant in digital output signal DIGITAL_OUT and the output of processing path 201b less dominant in digital output signal DIGITAL_OUT. In some embodiments, state machine 225 may wait for passage of a predetermined time after crossing of the threshold level before beginning to decrease the corner frequency. When decreasing the corner frequency, state machine 225 may do so continuously or in steps as the magnitude of the analog input signal decreases. Similarly, when below the threshold amplitude level, state machine 225 may cause the corner frequency to increase in response to increasing magnitude of the analog input signal.

Driver 219 may receive the filtered digital output signal FILTER_OUT generated by filter 230. Driver 219 may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating conditioned digital output signal DIGITAL_OUT for transmission over a bus to digital processor 109. In FIG. 2, the bus receiving conditioned digital output signal DIGITAL_OUT is shown as single-ended. In some embodiments, driver 219 may generate a differential conditioned digital output signal 107.

Figure 3:
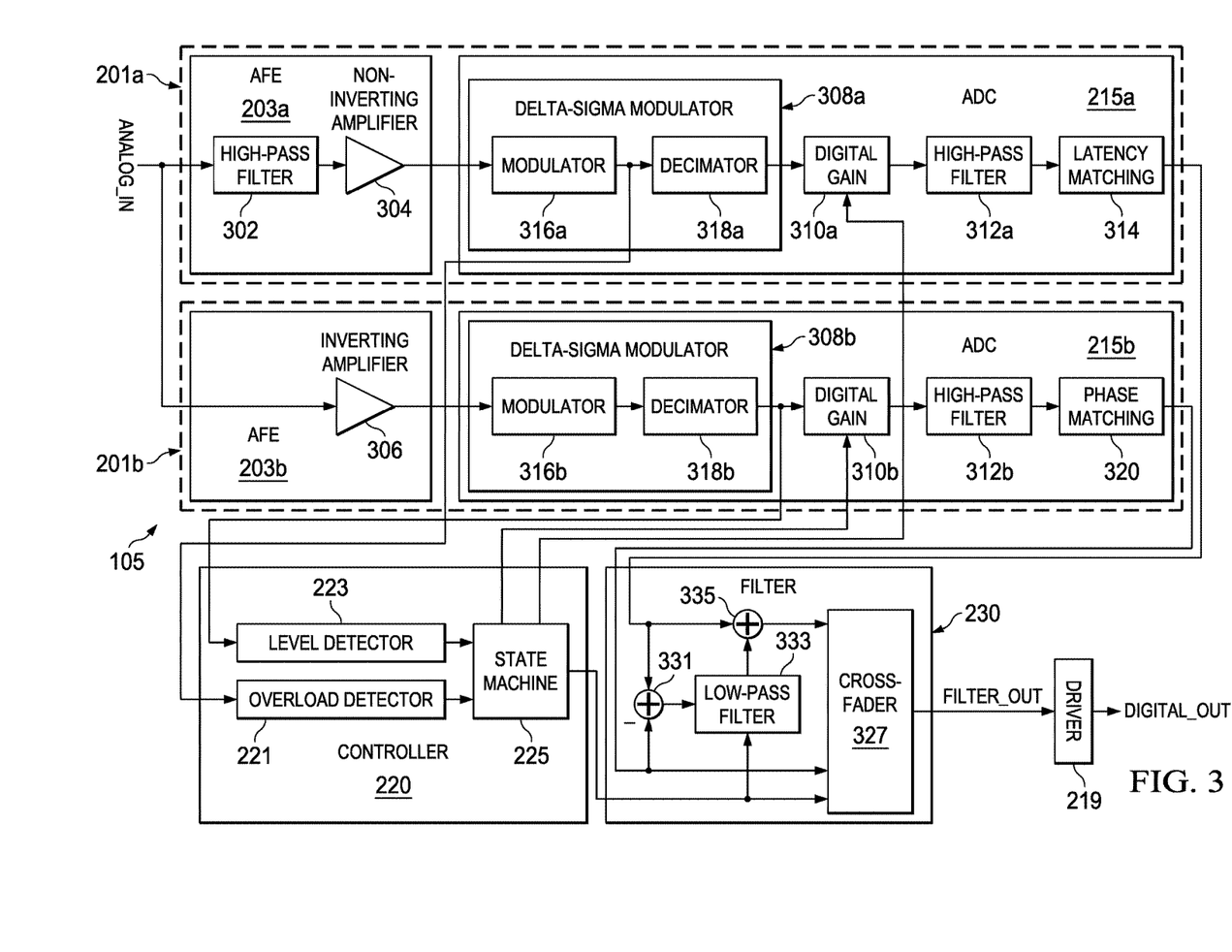
FIG. 3 illustrates a block diagram of selected components of the integrated circuit of FIG. 2 depicting selected components of example embodiments of analog front ends, analog-to-digital converters, and a filter, in accordance with embodiments of the present disclosure.

FIG. 3 illustrates a block diagram of selected components of integrated circuit 105 depicting selected components of example embodiments of AFEs 203, ADCs 215, and filter 230, in accordance with embodiments of the present disclosure. As shown in FIG. 3, analog front end 203a of processing path 201a may include a high-pass filter 302 configured to high-pass filter analog input signal ANALOG_IN to remove direct current offsets or biases, which are often particularly troublesome for high-gain amplifiers, and output such filtered signal to a non-inverting amplifier 304. Non-inverting amplifier 304 may amplify analog input signal ANALOG_IN by a non-inverting gain and communicate such amplified analog signal to ADC 215a. In some embodiments, high-pass filter 302 may be formed on the same integrated circuit as one or more of AFE 203a, AFE 203b, ADC 215a, and ADC 215b. Because of the presence of high-pass filter 302 in processing path 201a, but not processing path 201b, processing paths 201 may each have a different frequency response to analog input signal ANALOG_IN.

Also as shown in FIG. 3, analog front end 203b of processing path 201b may include an inverting amplifier 306 which may amplify analog input signal ANALOG_IN by an inverting gain and communicate such amplified analog signal to ADC 215b. In some embodiments, inverting amplifier 306 may be configured to apply a multiplicative gain of less than unity to analog input signal ANALOG_IN. By attenuating higher-amplitude signals, a greater dynamic range for analog input signal ANALOG_IN may be achieved, in spite of conventional wisdom that would generally dictate that signal loss should be avoided in a low-noise system. In these and other embodiments, although not depicted in FIG. 3, inverting amplifier 306 may receive the output of high-pass filter 302 instead of the unfiltered analog input signal ANALOG_IN.

Although AFEs 203a and 203b are described above having a non-inverting gain and an inverting gain, respectively, each of processing paths 201 may have approximately the same cumulative gain. Those of skill in the art may appreciate that simply applying a digital gain with a negative sign in either of ADC 215a or ADC 215b will negate the opposite polarities of the gains of AFEs 203.

As depicted in FIG. 3, each ADC 215 may include a respective delta-sigma modulator 308 (e.g., delta-sigma modulators 308a and 308b), a respective digital gain element 310 (e.g., digital gain elements 310a and 310b), and respective high-pass filters 312 (e.g., high-pass filters 312a and 312b). Each delta-sigma modulator 308 may be configured to modulate an analog signal into a corresponding digital signal. As known in the art, each delta-sigma modulator 308 may include a respective modulator 316 (e.g., modulators 316a, 316b) and a decimator 318 (e.g., decimators 318a, 318b). Each digital gain element 310 may apply a gain to a digital signal generated by its associated delta-sigma modulator 308. Each high-pass filter 312 may high-pass filter a digital signal generated by its associated digital gain element, to filter out any direct-current offsets present in the digital signal. High-pass filter 312b may also compensate for high-pass filter 302 present in AFE 203a.

In addition, ADC 215a may comprise a latency matching element 314 to match any signal latencies between processing path 201a and processing path 201b, while ADC 215b may comprise a phase matching element 320 to account for any phase offset between processing path 201a and processing path 201b. For example, phase matching element 320 may dynamically compensate for any phase mismatch between processing paths 201a and 201b by varying a delay of at least one of processing path 201a and processing path 201b. In some embodiments, phase matching element 320 may comprise a high-pass filter.

In some embodiments, a magnitude of a gain of non-inverting amplifier 304 may be substantially larger than (e.g., significantly more than manufacturing tolerances, one or more orders of magnitude) a magnitude of a gain of inverting amplifier 306. In addition, in these and other embodiments, a magnitude of digital gain element 310b may be substantially larger than (e.g., significantly more than manufacturing tolerances, one or more orders of magnitude) a magnitude of a gain of digital gain element 310a. Consequently, in such embodiments, a first path gain equal to the product of the magnitude of the gain of inverting amplifier 306 and the magnitude of a gain of digital gain element 310b may be substantially equal (e.g., within manufacturing tolerances) to a second path gain equal to the product of the magnitude of gain of non-inverting amplifier 304 and the gain of digital gain element 310a. As a specific example, in some embodiments, the inverting gain of inverting amplifier 306 may be approximately −6 decibels, the non-inverting gain of non-inverting amplifier 304 may be approximately 20 decibels, the gain of digital gain element 310a may be approximately −26 decibels, and the gain of digital gain element 310b may be approximately 0 decibels.

Accordingly, each processing path 201 may be adapted to process a particular amplitude of analog input signal ANALOG_IN. For example, AFE 203a may be suited to process lower signal amplitudes, as non-inverting amplifier 304 may have a practically infinite input resistance, may have a relatively low level of input-referred noise as compared to inverting amplifier 306, and its larger gain may permit effective processing of smaller signals, but characteristics of AFE 203a may not be amenable to higher amplitudes. The high input resistance of non-inverting amplifier 304 may facilitate the use of a smaller capacitor area for high-pass filter 302 (as compared to traditional approaches for implementing high-pass filters) and thus may permit integration of circuitry of high-pass filter 302 into the same integrated circuit as non-inverting amplifier 304, inverting amplifier 306, ADC 215a, and/or ADC 215b. In addition, the ability to integrate circuitry into a single integrated circuit may allow for centralized control of the stimuli for switching between processing paths 201 by controller 220, and may allow for more direct timing control of the actual switching and transitioning between processing paths 201. For example, because circuitry is integrated into a single integrated circuitry, level detector 223 may receive an output of delta-sigma modulator 308b as an input signal, rather than receiving an output of ADC 215b.

On the other hand, AFE 203b may be suited to process higher signal amplitudes, as its lower gain will reduce the likelihood of signal clipping, and may provide for greater dynamic range for analog input signal ANALOG_IN as compared to traditional approaches.

As described above with respect to FIG. 2, controller 220 may comprise any suitable system, device, or apparatus for controlling a corner frequency of filter 230. For example, overload detector 221 that may determine whether or not a signal derivative of analog input signal ANALOG_IN (e.g., an output of a modulator 316a of delta-sigma modulator 308a, as shown in greater detail in FIG. 3) is likely to cause clipping or other distortion of digital output signal DIGITAL_OUT if a particular processing path (e.g., processing path 201a) is the dominant component of digital output signal DIGITAL_OUT, and communicate a resulting signal to state machine 225, as described above with respect to FIG. 2. As another example, controller 220 may include a level detector 223 that may detect an amplitude of analog input signal ANALOG_IN or a signal derivative thereof (e.g., an output of a decimator 316b of delta-sigma modulator 308b, as shown in greater detail in FIG. 3) and communicate a signal indicative of such amplitude to state machine 225, as described above with respect to FIG. 2.

Despite a designer's best efforts to match the first path gain and the second path gain, process variations, temperature variations, manufacturing tolerances, and/or other variations may lead to the first path gain and the second path gain being unequal. If switching between paths occurs when such path gains are unequal, signal artifacts may occur due to an instantaneous, discontinuous change in magnitude of the digital output signal between two gain levels. For example, in audio signals, such artifacts may include human-perceptible "pops" or "clicks" in acoustic sounds generated from audio signals.

In some embodiments, in order to reduce or eliminate the occurrence of such artifacts when switching selection between the digital output signal of ADC 215a and the digital output signal of ADC 215b, and vice versa, controller 220 may program an additional gain into one or both of processing paths 201 to compensate for differences in the first path gain and second path gain. This additional gain factor may equalize the first path gain and the second path gain. To illustrate, controller 220 may determine a scale factor indicative of the magnitude of difference (e.g., whether an intentional difference or unintentional mismatch) between the first path gain of processing path 201a and the second path gain of processing path 201b. The controller may determine the first path gain and the second path gain by comparing the digital output signals of each processing path to analog input signal ANALOG_IN or a derivative thereof. If such digital output signals have been filtered by a high-pass filter (e.g., high-pass filters 312), a direct-current offset between the signals may be effectively filtered out, which may be necessary to accurately compute the relative path gains. Controller 220 may determine the scale factor by calculating one of a root mean square average of the first path gain and the second path gain and a least mean squares estimate of the difference between the first path gain and the second path gain. Prior to switching selection between the first digital signal generated by ADC 215a and the second digital signal generated by ADC 215b (or vice versa), controller 220 may program an additional gain into one of processing paths 201 to compensate for the gain difference indicated by the scale factor. For example, controller 220 may calibrate one or both of the first path gain and the second path gain by applying a gain equal to the scale factor or the reciprocal of the gain factor (e.g., 1/gain factor), as appropriate. Such scaling may be performed by modifying one or both of digital gains 310. In some embodiments, controller 220 may apply the additional gain to the processing path 201 of the digital signal not selected as digital output signal DIGITAL_OUT. For example, controller 220 may apply the additional gain to processing path 201a when the digital signal of ADC 215b is selected as digital output signal DIGITAL_OUT and apply the additional gain to processing path 201b when the digital signal of ADC 215a is selected as digital output signal DIGITAL_OUT.

In some embodiments, the additional gain, once applied to a path gain of a processing path 201, may be allowed over a period of time to approach or "leak" to a factor of 1, in order to constrain the additional gain and compensate for any cumulative (e.g., over multiple switching events between digital signals of ADCs 215) bias in the calculation of the additional gain. Without undertaking this step to allow the additional gain to leak to unity, multiple switching events between paths may cause the gain factor to increase or decrease in an unconstrained manner as such additional gain, if different than unity, affects the outputs of the multiple paths and thus affects the calculation of the scaling factor.

As shown in FIG. 3, an example filter 230 may include a combiner 331, a low-pass filter 333, a combiner 335, and a cross-fader 327. Combiner 331 may receive a respective digital signal from each of processing paths 201 and determine a difference between the two digital signals. The difference may be filtered by a low-pass filter 333 to generate a filtered difference. In some embodiments, low-pass filter 333 may have a variable corner frequency, wherein the variable corner frequency is controlled based on a control signal generated by and communicated from a controller 220, as described above. The filtered difference output by low-pass filter 333 may be summed by combiner 335 with the digital signal output by one of the processing paths (e.g., processing path 201a) to generate a digital output signal.

A crossfader 327 may receive the digital output signal received from combiner 335 and the digital signal output by one of the processing paths (e.g., processing path 201b) and output filtered digital output signal FILTER_OUT comprising a weighted average of the digital output signal and the digital signal output by processing path 201b based on a control signal generated by and communicated from a controller 220. In some embodiments, crossfader 327 may not be present, in which case the digital output signal generated by combiner 335 may be communicated to driver 219 as filtered digital output signal FILTER_OUT.

In some embodiments, to reduce or eliminate artifacts from occurring when varying a corner frequency to adjust the relative dominance of processing paths 201 in digital output signal DIGITAL_OUT, controller 220 and crossfader 327 may be configured to transition, continuously or in steps, filtered digital output signal FILTER_OUT from a first digital signal (e.g., output of processing path 201*b*) to the digital output signal generated by combiner 335, or vice versa, such that during such transition, digital output signal DIGITAL_OUT is a weighted average of the first digital signal and the digital output signal. For example, for decreases in the magnitude of the analog input signal, crossfader 327 may transition from the first digital signal to the digital output signal generated by combiner 335 such that a weight of the digital output signal relative to the weight of the first digital signal increases during the transition. Similarly, for increases in the magnitude of the analog input signal, crossfader 327 may transition from the digital output signal generated by combiner 335 to the first digital signal such that a weight of the first digital signal relative to the weight of the digital output signal increases during the transition.

Figure 4:
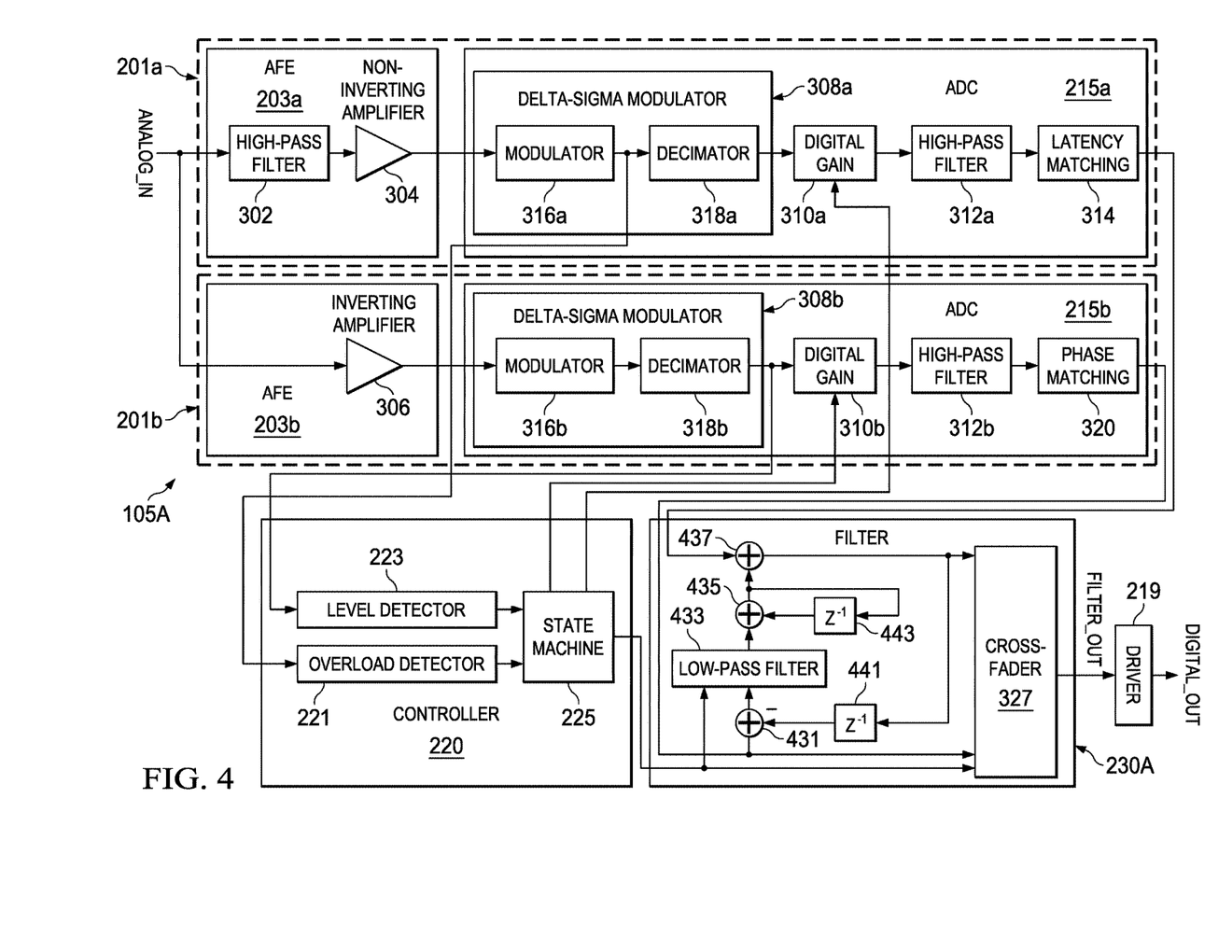
FIG. 4 illustrates a block diagram of selected components of the integrated circuit of FIG. 2 depicting selected components of example embodiments of analog front ends, analog-to-digital converters, and another filter, in accordance with embodiments of the present disclosure.

FIG. 4 illustrates a block diagram of selected components of integrated circuit 105A depicting a different example filter 230A, in accordance with embodiments of the present disclosure. Integrated circuit 105A depicted in FIG. 4 may be similar to that of integrated circuit 105 of FIG. 3, and thus only the differences between integrated circuit 105A depicted in FIG. 4 and integrated circuit 105 of FIG. 3 are discussed below. In particular, in integrated circuit 105A, filter 230 of FIG. 3 is replaced with example filter 230A. As shown in FIG. 4, example filter 230A may include a low-pass filter 433, combiners 431, 435, and 437, and delay blocks 441 and 443. As shown in FIG. 4, low-pass filter 433 may generate a filtered difference signal by low-pass filtering a difference (e.g., generated by combiner 431) between the digital output signal generated by processing path 201*b* and a filtered digital signal based on the digital output signal generated by processing path 201*a*, as delayed by delay block 441. A corner frequency of low-pass filter 433 may be controlled by controller 220, as described elsewhere in this disclosure. Such filtered difference signal may be integrated by combiner 435 and delay block 443, which as depicted in FIG. 4, may operate as a signal integrator to generate an integrated filtered difference signal. The integrated filtered difference signal may then be combined with the digital output signal generated by processing path 201*a* to generate the filtered digital signal. Crossfader 327 may receive the filtered digital signal received from combiner 437 and the digital signal output by processing path 201*b* and output filtered digital output signal FILTER_OUT comprising a weighted average of the filtered digital signal and the digital signal output by processing path 201*b* based on a control signal generated by and communicated from a controller 220.

The presence of filter 230 (or 230A) may be advantageous so as to decrease a minimum time needed to switch between selection of processing paths 201 as the dominant processing path contributing to filtered digital output signal FILTER_OUT. For example, high-pass filters in each of processing paths 201 (e.g., high-pass filter 302 and phase matching element 320) may contribute to differences between processing paths 201, particularly in response to impulsive sound events in analog input signal ANALOG_IN. Due to such differences, and in the absence of filter 230 to frequency modulate between the paths, switching between processing paths 201 may lead to audio artifacts unless switching between paths is delayed. By including filter 230 in integrated circuit 105, such delay may be decreased over embodiments not having filter 230.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
    a plurality of signal paths including a first signal path and a second signal path, wherein:
        the first signal path is configured to generate a first path output signal based on an input signal; and
        the second signal path is configured to generate a second path output signal based on the input signal; and
    a filter having a corner frequency and configured to generate a filtered output signal combining spectral components of the first path output signal lower than the corner frequency and spectral components of the second path output signal higher than the corner frequency to generate the filtered output signal.

2. The system of claim 1, wherein the filter comprises:
    a low-pass filter configured to low-pass filter a difference between the second path output signal and the first path output signal to generate a filtered difference in accordance with a corner frequency of the low-pass filter; and
    a combiner configured to sum the second path output signal and the filtered difference to generate the filtered signal, wherein the filtered output signal is based on the filtered signal.

3. The system of claim 2, further comprising a controller configured to:
    set the corner frequency based on a magnitude of the input signal; and
    in response to an increase in the magnitude of the input signal, transition continuously or in steps the filtered output signal between the first path output signal and the second path output signal during a duration of time, and such that during such transition, the filtered output signal is a weighted average of the second path output signal and the filtered signal wherein a weight of the second path output signal relative to a weight of the filtered signal increases during the transition.

4. The system of claim 2, further comprising a controller configured to:
set the corner frequency based on a magnitude of the input signal; and
in response to a decrease in the magnitude of the input signal, transition continuously or in steps the filtered output signal between the second path output signal and the filtered signal during a duration of time, and such that during such transition, the filtered output signal is a weighted average of the second path output signal and the filtered signal wherein a weight of the filtered signal relative to a weight of the second path output signal increases during the transition.

5. The system of claim 1, further comprising a controller configured to set the corner frequency based on a magnitude of the input signal.

6. The system of claim 5, wherein the controller is configured to increase the corner frequency in response to an increase in the magnitude of the input signal.

7. The system of claim 5, wherein the controller is configured to decrease the corner frequency in response to a decrease in the magnitude of the input signal.

8. The system of claim 5, wherein the controller is configured to decrease the corner frequency in response to:
a decrease in the magnitude of the input signal below a predetermined threshold; and
passage of a predetermined duration of time after the decrease in the magnitude below the predetermined threshold.

9. The system of claim 8, wherein the controller is configured to decrease the corner frequency continuously or in steps as the magnitude of the input signal decreases.

10. The system of claim 1, wherein the system is an audio processing system, and the input signal and the filtered output signal are each an audio signal.

11. The system of claim 1, wherein the filter comprises:
a low-pass filter configured to low-pass filter a difference between the second path output signal and a filtered signal based on the first path output signal to generate a filtered difference in accordance with a corner frequency of the low-pass filter;
an integrator configured to integrate the filtered difference to generate an integrated filtered difference; and
a combiner configured to sum the first path output signal and the integrated filtered difference to generate the filtered signal;
wherein the filtered output signal is a weighted average of the second path output signal and the filtered signal.

12. A method comprising:
processing an input signal with a first processing path to generate a first output path signal based on the input signal;
processing the input signal with a second processing path to generate a second output path signal based on the input signal; and
generating, with a filter having a corner frequency, a filtered output signal combining spectral components of the first output path signal lower than the corner frequency and spectral components of the second output path signal higher than the corner frequency to generate the filtered output signal.

13. The method of claim 12, wherein generating the filtered output signal comprises:
a low-pass filtering a difference between the second output path signal and the first output path signal to generate a filtered difference in accordance with a corner frequency of the low-pass filter; and
summing the second output path signal and the filtered difference to generate a filtered signal, wherein the filtered output signal is based on the filtered signal.

14. The method of claim 13, further comprising:
setting the corner frequency based on a magnitude of the input signal; and
in response to an increase in the magnitude of the input signal, transitioning continuously or in steps the filtered output signal between the filtered signal and the second output path signal during a duration of time, and such that during such transition, the filtered output signal is a weighted average of the second output path signal and the filtered signal wherein a weight of the second output path signal relative to a weight of the filtered signal increases during the transition.

15. The method of claim 13, further comprising:
setting the corner frequency based on a magnitude of the input signal; and
in response to a decrease in the magnitude of the input signal, transitioning continuously or in steps the filtered output signal between the second output path signal and the filtered signal during a duration of time, and such that during such transition, the filtered output signal is a weighted average of the second output path signal and the filtered signal wherein a weight of the filtered signal relative to a weight of the second output path signal increases during the transition.

16. The method of claim 12, further comprising setting the corner frequency based on a magnitude of the input signal.

17. The method of claim 16, further comprising increasing the corner frequency in response to an increase in the magnitude of the input signal.

18. The method of claim 16, further comprising decreasing the corner frequency in response to a decrease in the magnitude of the input signal.

19. The method of claim 16, further comprising decreasing the corner frequency in response to:
a decrease in the magnitude of the input signal below a predetermined threshold; and
passage of a predetermined duration of time after the decrease in the magnitude below the predetermined threshold.

20. The method of claim 19, further comprising decreasing the corner frequency continuously or in steps as the magnitude of the input signal decreases.

21. The method of claim 12, wherein the input signal and the filtered signal are each an audio signal.

22. The method of claim 12, wherein generating the filtered output signal comprises:
low-pass filtering a difference between the second output path signal and a filtered signal based on the first output path signal to generate a filtered difference in accordance with a corner frequency of the low-pass filter;
integrating the filtered difference to generate an integrated filtered difference; and
summing the first output path signal and the integrated filtered difference to generate the filtered signal;
wherein the filtered output signal is a weighted average of the second output path signal and the filtered signal.

* * * * *